(12) United States Patent
Fayaz et al.

(10) Patent No.: US 7,214,548 B2
(45) Date of Patent: May 8, 2007

(54) APPARATUS AND METHOD FOR FLATTENING A WARPED SUBSTRATE

(75) Inventors: Mohammed F. Fayaz, Pleasantville, NY (US); Steffen K. Kaldor, Fishkill, NY (US); Conal E. Murray, Yorktown Heights, NY (US); Ismail C. Noyan, Chappaqua, NY (US); Anne L. Petrosky, Lagrangeville, NY (US)

(73) Assignee: International Business Machines Corporation, Armonk, NY (US)

(*) Notice: Subject to any disclaimer, the term of this patent is extended or adjusted under 35 U.S.C. 154(b) by 388 days.

(21) Appl. No.: 10/929,179

(22) Filed: Aug. 30, 2004

(65) Prior Publication Data

US 2006/0055073 A1 Mar. 16, 2006

(51) Int. Cl.
*H01L 21/00* (2006.01)
(52) U.S. Cl. ............................. 438/4; 702/85
(58) Field of Classification Search ............ 438/5
See application file for complete search history.

(56) References Cited

U.S. PATENT DOCUMENTS

| | | | |
|---|---|---|---|
| 4,313,284 A * | 2/1982 | Walsh | 451/288 |
| 5,382,551 A * | 1/1995 | Thakur et al. | 438/8 |
| 5,492,866 A * | 2/1996 | Nishikawa | 29/827 |
| 5,733,182 A * | 3/1998 | Muramatsu et al. | 451/289 |
| 5,869,387 A * | 2/1999 | Sato et al. | 438/459 |
| 5,926,742 A * | 7/1999 | Thakur et al. | 438/795 |
| 6,013,541 A * | 1/2000 | Tan et al. | 438/106 |
| 6,830,719 B2 * | 12/2004 | Gochnour et al. | 264/231 |
| 2003/0209310 A1 * | 11/2003 | Fuentes et al. | 156/154 |
| 2004/0185662 A1 * | 9/2004 | Fujisawa et al. | 438/689 |

* cited by examiner

Primary Examiner—David A. Zarneke
(74) Attorney, Agent, or Firm—Schmeiser, Olsen & Watts; Robert Trepp

(57) ABSTRACT

A method, apparatus, and computer program product for flattening a warped substrate. The substrate is placed on a planar surface of a clamping apparatus in direct mechanical contact with the planar surface. The substrate comprises surface regions $S_1, S_2, \ldots, S_N$ having an average warpage of $W_1, W_2, \ldots, W_N$, respectively, wherein $W_1 \leq W_2 \leq \ldots \leq W_N$ and $W_1 \leq W_N$. Zones $Z_1, Z_2, \ldots, Z_N$ of the planar surface respectively comprise vacuum port groups $G_1, G_2, \ldots, G_N$. Each group comprises at least one vacuum port. N is at least 2. A vacuum pressure $P_{V1}, P_{V2}, \ldots, P_{VN}$ is generated at each vacuum port within group $G_1, G_2, \ldots, G_N$, at a time of $T_1, T_2, \ldots, T_N$ to clamp surface region $S_1, S_2, \ldots, S_N$ to zone $Z_1, Z_2, \ldots, Z_N$, respectively. The vacuum pressure $P_{V1}, P_{V2}, \ldots, P_{VN}$ is maintained at the vacuum ports of group $G_1, G_2, \ldots, G_N$, respectively, until time $T_{N+1}$. $T_1 < T_2 < \ldots < T_N < T_{N+1}$.

29 Claims, 12 Drawing Sheets

APPARATUS AND METHOD FOR FLATTENING A WARPED SUBSTRATE

BACKGROUND OF THE INVENTION

1. Technical Field

The present invention relates to an apparatus and method for flattening a warped substrate.

2. Related Art

During manufacturing processes of semiconductor technology, films of various materials are sequentially deposited and patterned on a silicon substrate. For back-end-of-line (BEOL) processing of semiconductor wafers, these deposited materials include metallization levels for interconnect structures, dielectric levels used for insulation and capping, and barrier layers to prevent diffusion and oxidation of the interconnect structures. A current choice for interconnect metallization is copper, manufactured in a dual-damascene method. Dielectric materials include silicon oxide deposited by the plasma enhanced chemical vapor deposition (PECVD) using silane ($SiH_4$) or tetraethylorthosilicate (TEOS) precursors or organosilicate glass or SiCOH or carbon doped oxides deposited by chemical vapor deposition (CVD) for high-performance interconnect applications. Barrier layers include tantalum, tungsten and titanium-based alloys. Because the deposition processes can induce intrinsic stresses within these layers, the resulting film/substrate combination can bend or warp the wafer surface from a flat profile to one that bows up or down toward the wafer edge.

In order to reduce production costs associated with manufacture of each wafer, the semiconductor industry has implemented the use of 300 mm diameter silicon substrates over 200 mm substrates. As the extent of warpage increases, the effective clearance in the manufacturing equipment through which the wafer passes decreases. In some cases, the warpage is severe enough so that wafers will either damage equipment within the fabrication machinery or become blocked which stops the manufacturing line. As semiconductor wafers move from 200 mm in diameter to 300 mm in diameter, the amount of deflection observed between the wafer center and edge increases for equivalent values of stress in the microcircuitry, leading to even greater occurrences of problems.

Thus, there is a need for mitigating at least one of the aforementioned problems associated with a warped semiconductor wafer during manufacturing processes of semiconductor technology.

SUMMARY OF THE INVENTION

The present invention provides a method for flattening a warped substrate, comprising:

placing the warped substrate on a planar surface of a clamping apparatus such that an external surface of the substrate is in direct mechanical contact with the planar surface, wherein the external surface of the substrate comprises N surface regions $S_1, S_2, \ldots, S_N$ having an average warpage of $W_1, W_2, \ldots, W_N$, respectively, wherein $W_1 \leq W_2 \leq \ldots \leq W_N$ and $W_1 < W_N$, wherein zones $Z_1, Z_2, \ldots, Z_N$ of the planar surface respectively comprise vacuum port groups $G_1, G_2, \ldots, G_N$, wherein each vacuum port group comprises at least one vacuum port, and wherein N is at least 2; and generating a vacuum pressure $P_{V1}, P_{V2}, \ldots, P_{VN}$ at each vacuum port within group $G_1, G_2, \ldots, G_N$, at a time of $T_1, T_2, \ldots, T_N$ to clamp surface region $S_1, S_2, \ldots, S_N$ to zone $Z_1, Z_2, \ldots, Z_N$, respectively, wherein the vacuum pressure $P_{V1}, P_{V2}, \ldots, P_{VN}$ is maintained at the vacuum ports of group $G_1, G_2, \ldots, G_N$, respectively, until time $T_{N+1}$, and wherein $T_1 < T_2 < \ldots < T_N < T_{N+1}$.

The present invention provides a clamping apparatus, comprising:

a planar surface adapted to have a substrate placed thereon such that an external surface of the substrate is in direct mechanical contact with the planar surface, wherein the external surface of the substrate comprises N surface regions $S_1, S_2, \ldots, S_N$ having an average warpage of $W_1, W_2, \ldots, W_N$, respectively, wherein $W_1 < W_2 < \ldots < W_N$ and $W_1 < W_N$, wherein zones $Z_1, Z_2, \ldots, Z_N$ of the planar surface respectively comprise vacuum port groups $G_1, G_2, \ldots, G_N$, wherein each vacuum port group comprises at least one vacuum port, and wherein N is at least 2; and means for generating a vacuum pressure $P_{V1}, P_{V2}, \ldots, P_{VN}$ at each vacuum port within group $G_1, G_2, \ldots, G_N$, at a time of $T_1, T_2, \ldots, T_N$ to clamp surface region $S_1, S_2, \ldots, S_N$ to zone $Z_1, Z_2, \ldots, Z_N$, respectively, wherein the vacuum pressure $P_{V1}, P_{V2}, \ldots, P_{VN}$ is maintained at the vacuum ports of group $G_1, G_2, \ldots, G_N$, respectively, until time $T_{N+1}$, and wherein $T_1 < T_2 < \ldots < T_N < T_{N+1}$.

The present invention provides a computer program product, comprising a computer usable medium having a computer readable program code embodied therein, said computer readable program code comprising an algorithm adapted to implement a method for flattening a warped substrate placed on a planar surface of a clamping apparatus such that an external surface of the substrate is in direct mechanical contact with the planar surface, wherein the external surface of the substrate comprises N surface regions $S_1, S_2, \ldots, S_N$ having an average warpage of $W_1, W_2, \ldots, W_N$, respectively, wherein $W_1 \leq W_2 \leq \ldots \leq W_N$ and $W_1 < W_N$, and wherein N is at least 2, said method comprising:

identifying zones $Z_1, Z_2, \ldots, Z_N$ of the planar surface which respectively comprise vacuum port groups $G_1, G_2, \ldots, G_N$, wherein each vacuum port group comprises at least one vacuum port; and controlling generation of a vacuum pressure $P_{V1}, P_{V2}, \ldots, P_{VN}$ at each vacuum port within group $G_1, G_2, \ldots, G_N$, at a time of $T_1, T_2, \ldots, T_N$ to clamp surface region $S_1, S_2, \ldots, S_N$ to zone $Z_1, Z_2, \ldots, Z_N$, respectively, wherein the vacuum pressure $P_{V1}, P_{V2}, \ldots, P_{VN}$ is maintained at the vacuum ports of group $G_1, G_2, \ldots, G_N$, respectively, until time $T_{N+1}$, and wherein $T_1 < T_2 < \ldots < T_N < T_{N+1}$.

The present invention advantageously mitigates at least one problem of the prior art associated with a warped semiconductor wafer during manufacturing processes of semiconductor technology.

DETAILED DESCRIPTION OF THE INVENTION

Figure 1:
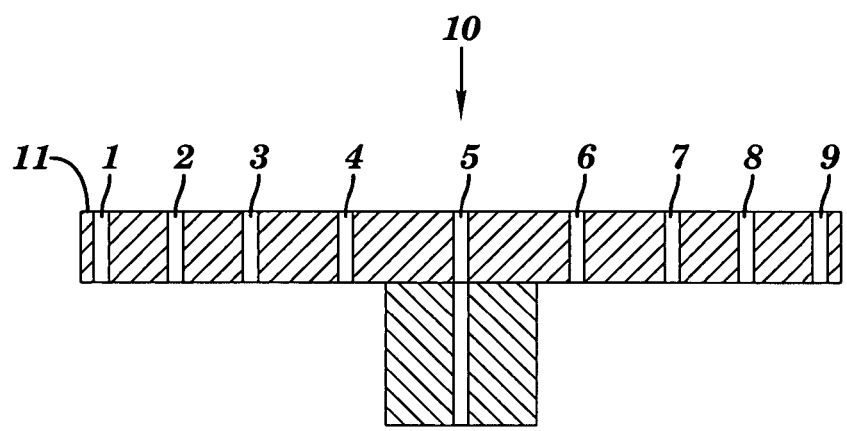
FIG. 1 depicts a front cross-sectional view of a vacuum chuck having a planar surface, in accordance with embodiments of the present invention.
Figure 2:
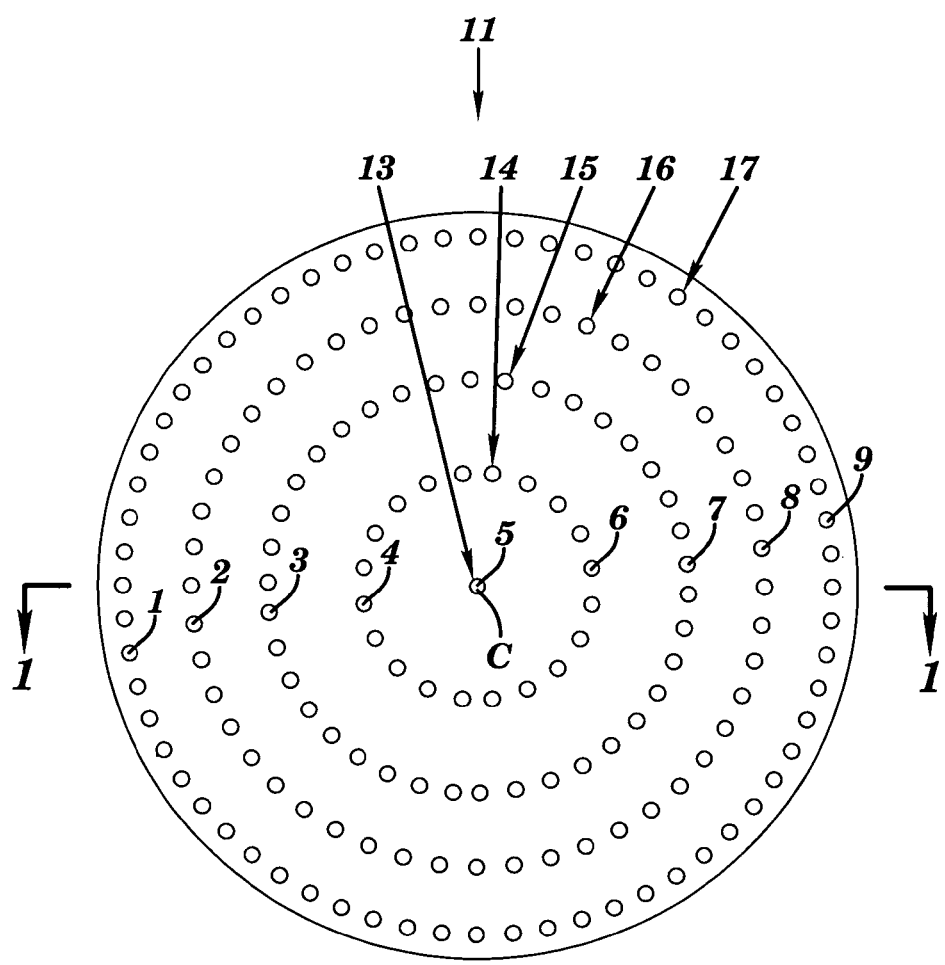
FIG. 2 depicts a top view of the vacuum chuck of FIG. 1 wherein the planar surface of the vacuum chuck has a circular shape, in accordance with embodiments of the present invention.
Figure 3:
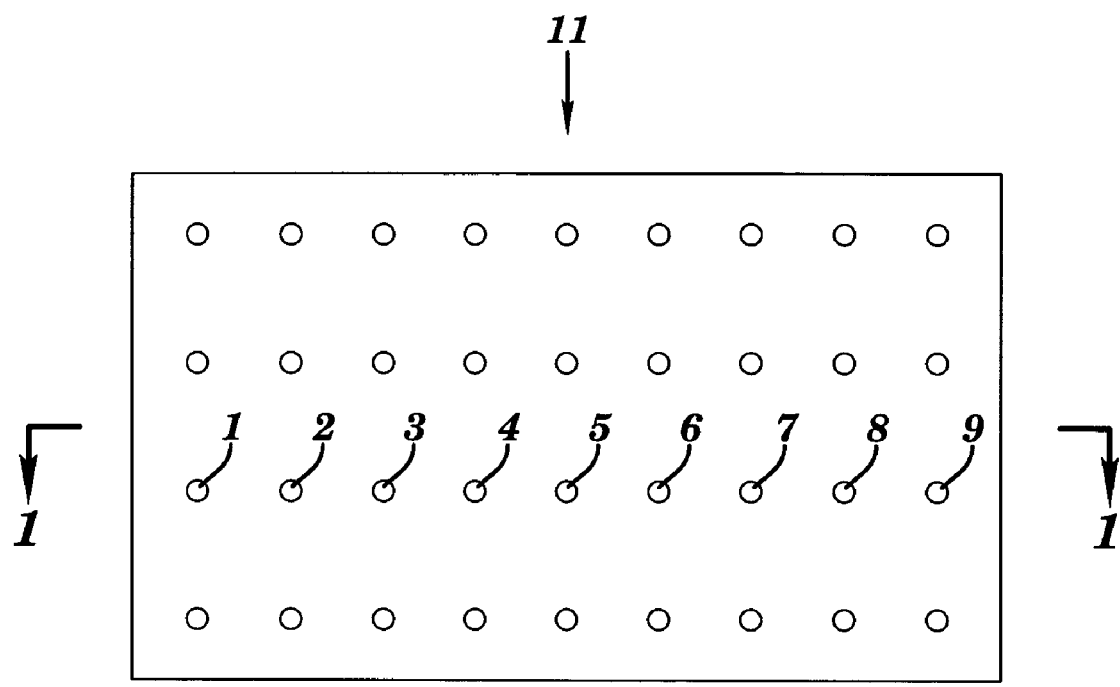
FIG. 3 depicts a top view of the vacuum chuck of FIG. 1 wherein the planar surface of the vacuum chuck has a rectangular shape, in accordance with embodiments of the present invention.

FIG. 1 depicts a front cross-sectional view of a vacuum chuck 10 having a planar surface 11, in accordance with embodiments of the present invention. The vacuum chuck 10 comprises vacuum ports 1–9 as well as other vacuum ports not shown in the cross-sectional view of FIG. 1, but shown in the top view of FIGS. 2 and 3. The vacuum ports 1–9 in FIG. 1 are a result of holes formed in the vacuum chuck 10 and are each adapted to hold a partial vacuum (i.e., be depressurized) by a clamping apparatus that includes a pressure regulating system 50 described infra in conjunction with FIG. 18. The outer boundary of the planar surface 11 may have any geometrical shape. For example, FIGS. 2 and 3 depict the planar surface 11 as having a circular shape and a rectangular shape, respectively. Accordingly, the cross-sectional view of FIG. 1 represents a planar cut 1—1 perpendicular to the top surface 11 of FIG. 2 or FIG. 3.

The vacuum chuck 10 of FIG. 1 is adapted to hold and flatten a warped substrate (e.g., a warped semiconductor wafer) against the planar surface 11 as will be described infra. In practice, warpage may build up gradually on the wafer through several initial processing steps of semiconductor fabrication until the warpage is severe enough to cause significant problems during subsequent processing steps. Accordingly, such a vacuum chuck 10 may be placed inside one or more process tools during subsequent processing steps (e.g., subsequent plating or layer deposition steps) of the semiconductor fabrication so that the subsequent processing steps may be implemented while the wafer is flat. Thus, the wafer is flattened in the process tool of each such process step until the process step has been completed. Since the flattening is temporary, the wafer is warped between such process steps.

FIG. 2 depicts a top view of the vacuum chuck 10 of FIG. 1 wherein the planar surface 11 of the vacuum chuck 10 has a circular shape, in accordance with embodiments of the present invention. FIG. 2 shows rings 13–17 of vacuum ports such that the vacuum ports in successive rings are arranged in concentric circular patterns with respect to the geometrical center C of the planar surface 11. The collection of vacuum ports in each ring is called a vacuum port group. Ring 13 comprises a vacuum port group that includes the vacuum port 5 of FIG. 1 located at the geometrical center C of the planar surface 11. Ring 14 comprises a vacuum port group that includes 20 vacuum ports, wherein two opposite ports (i.e., 180 degrees apart) of ring 14 are vacuum ports 4 and 6 of FIG. 1. Ring 15 comprises a vacuum port group that includes 35 vacuum ports, wherein two opposite ports of ring 15 are vacuum ports 3 and 7 of FIG. 1. Ring 16 comprises a vacuum port group that includes 53 vacuum ports, wherein two opposite ports of ring 16 are vacuum ports 2 and 8 of FIG. 1. Ring 17 comprises a vacuum port group that includes 64 vacuum ports, wherein two opposite ports of ring 17 are vacuum ports 1 and 9 of FIG. 1.

FIG. 3 depicts a top view of the vacuum chuck 10 of FIG. 1 wherein the planar surface 11 of the vacuum chuck 10 has a rectangular shape, in accordance with embodiments of the present invention. FIG. 1 shows a rectangular array of vacuum ports including the vacuum ports 1–9 in the cross-sectional view of FIG. 1.

FIGS. 2 and 3 each depict a spatially uniform distribution of vacuum ports. In FIG. 2 the vacuum ports are distributed uniformly in each ring, and in FIG. 3 the vacuum ports are distributed uniformly in each of two mutually orthogonal directions. In general, however, the vacuum ports may have any spatial distribution on the surface 11 of the vacuum chuck 10 (see FIG. 1). For example, the surface density of vacuum ports could be higher where a certain section of the warped substrate feature to be flattened is known to have a high degree of curvature.

FIGS. 4–7 depict successive steps in which a warped substrate 20 is sequentially (timewise) clamped to the planar surface 11 of the vacuum chuck 10 of FIG. 1 to flatted the substrate 20, in accordance with embodiments of the present invention. The warpage (W) is defined as a displacement of the substrate 20 in the direction 35 that is normal to the planar surface 11 on which the substrate 30 is placed. In FIGS. 4, 5, 6, and 7, the vacuum port 5, (4 and 6), (3 and 7), (2 and 8, 1 and 9) are respectively depressurized in successive time intervals, so that corresponding portions of the wafer 20 are flattened against the planar surface 11 of the vacuum chuck 10 in the successive time intervals. Once depressurized, a vacuum port maintains its depressurization as additional vacuum ports become depressurized. Accordingly, the entire substrate 20 has been flatted in FIG. 7.

Figure 4:
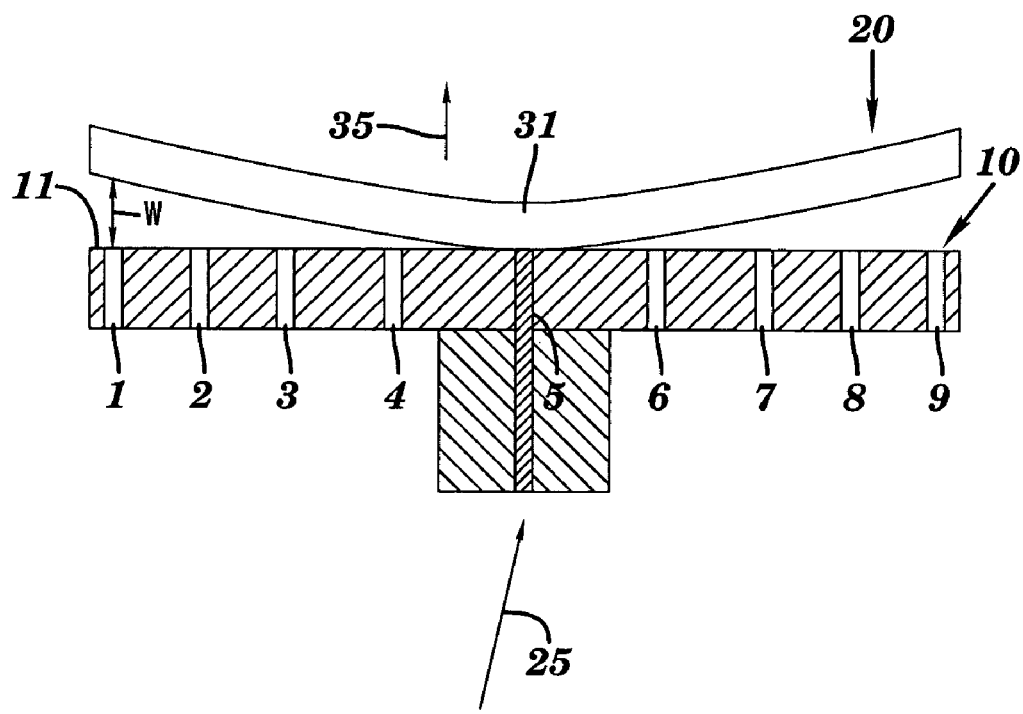
FIGS. 4–7 depict successive steps in which a warped substrate is sequentially clamped to the planar surface of the vacuum chuck of FIG. 1 to flatten the substrate, in accordance with embodiments of the present invention.

In FIG. 4, the arrow 25 denotes that vacuum port 5 is depressurized so as to flatten a central portion 31 of the substrate 20 against the planar surface 11 of the vacuum chuck 10.

Figure 5:
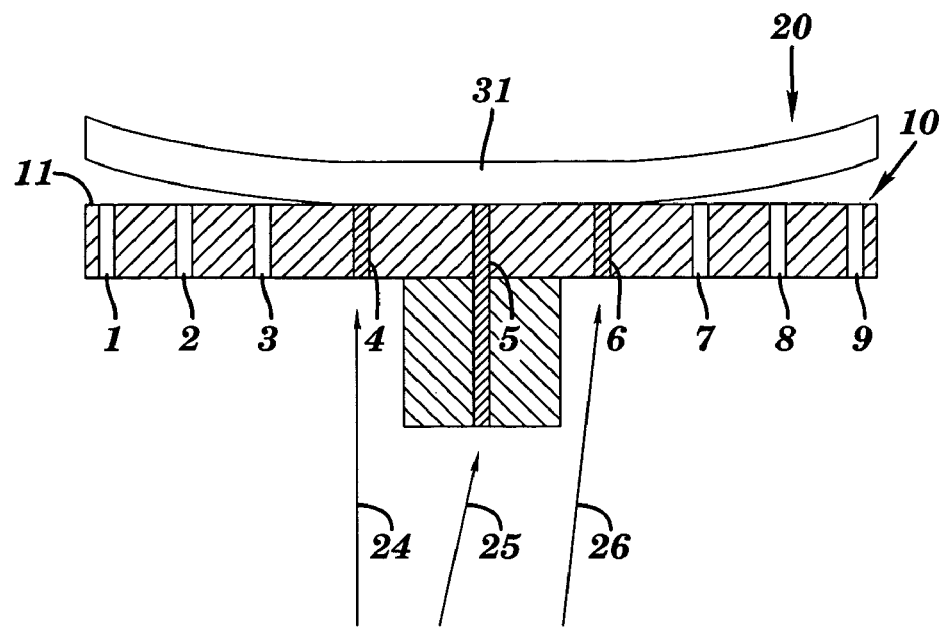

In FIG. 5, the arrows 24–26 denote that vacuum ports 4–6 are depressurized so as to further flatten the substrate 20 peripherally outward from the central portion 31 of the substrate 20.

Figure 6:
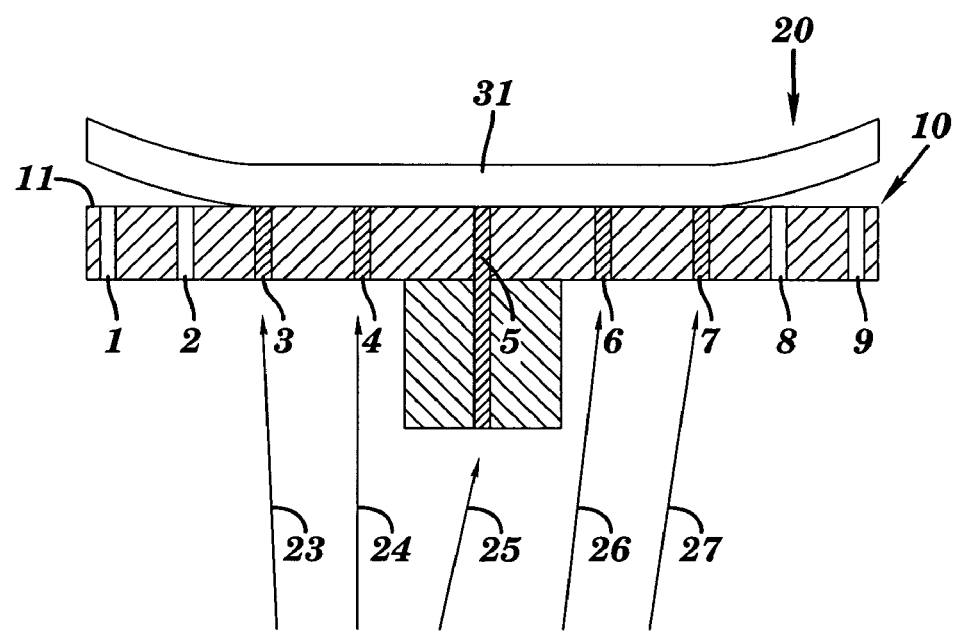

In FIG. 6, the arrows 23–27 denote that vacuum ports 3–7 are depressurized so as to further flatten the substrate 20 peripherally outward from the central portion 31 of the substrate 20.

Figure 7:
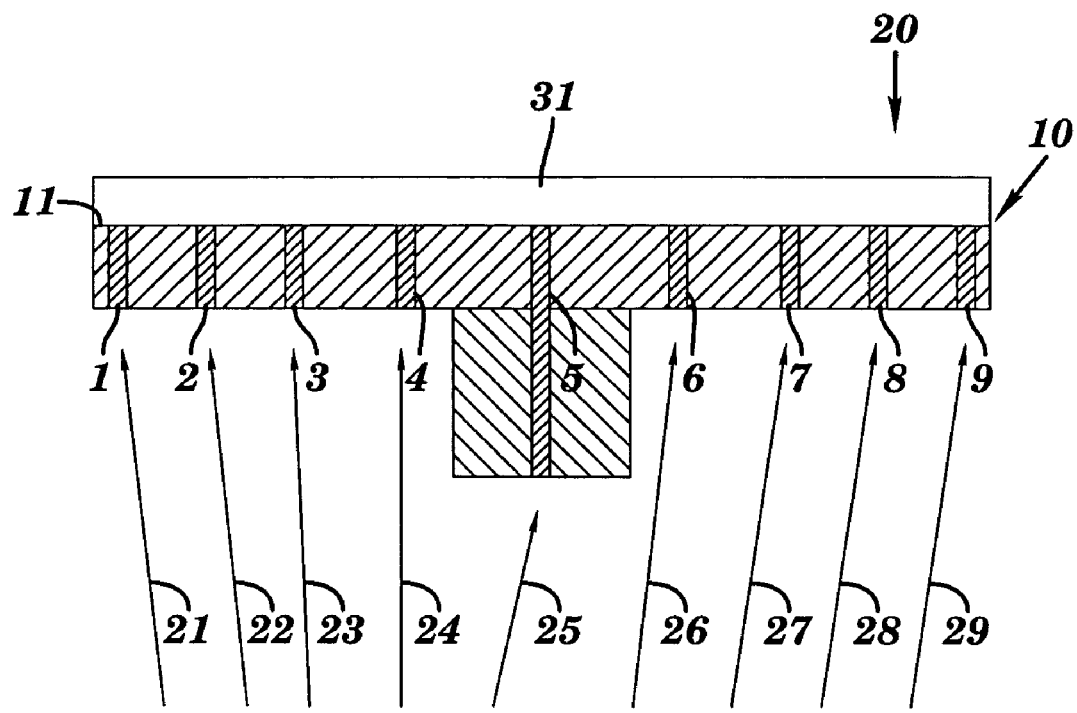

In FIG. 7, the arrows 21–29 denote that vacuum ports 1–9 are depressurized so as to further flatten the substrate 20 peripherally outward from the central portion 31 of the substrate 20 such that the substrate 20 has been completely flattened.

Figure 9:
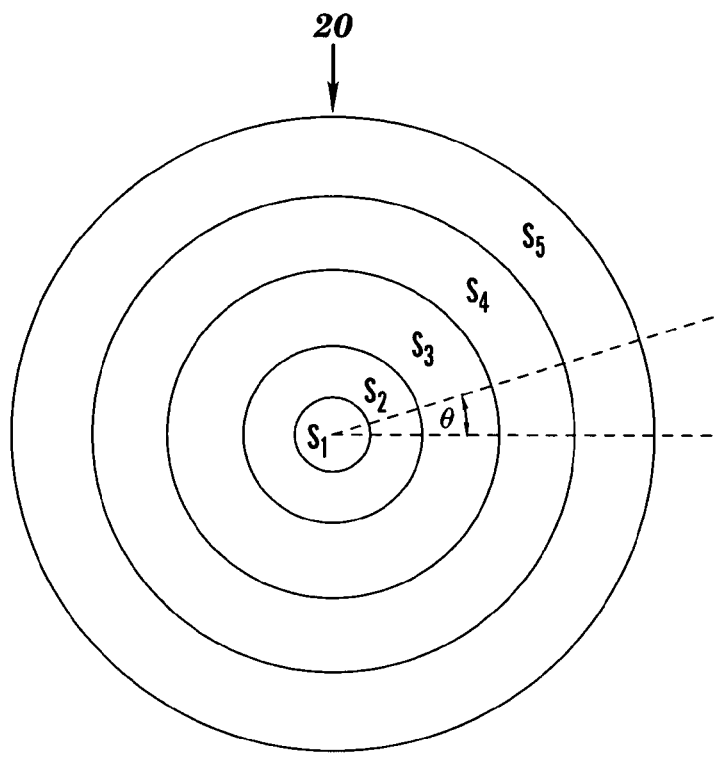
FIGS. 9–11 each depict a top view of the warped substrate of FIGS. 4–7 such that surface regions on the top surface of the substrate reflect the spatial distribution of the warpage, in accordance with embodiments of the present invention.
Figure 10:
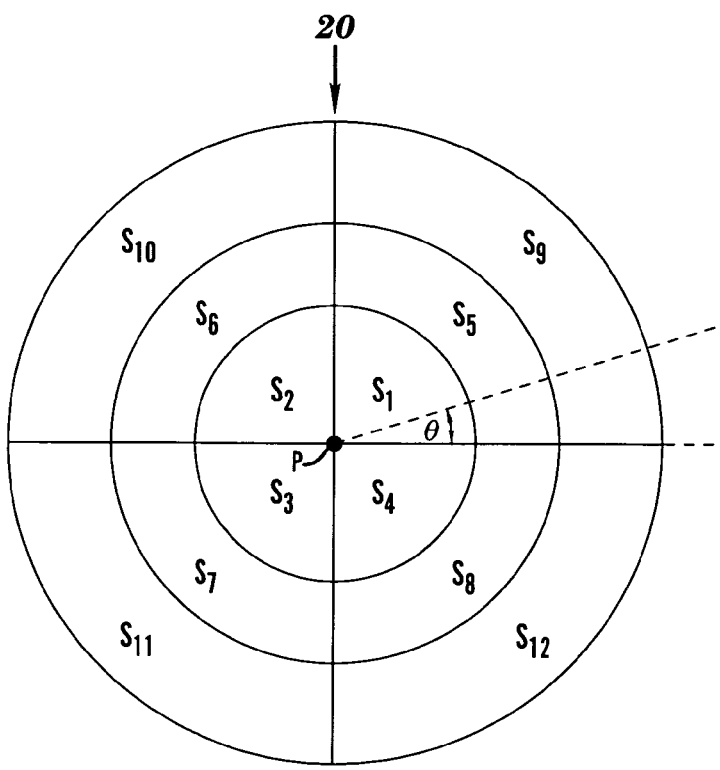
Figures 11, 12:
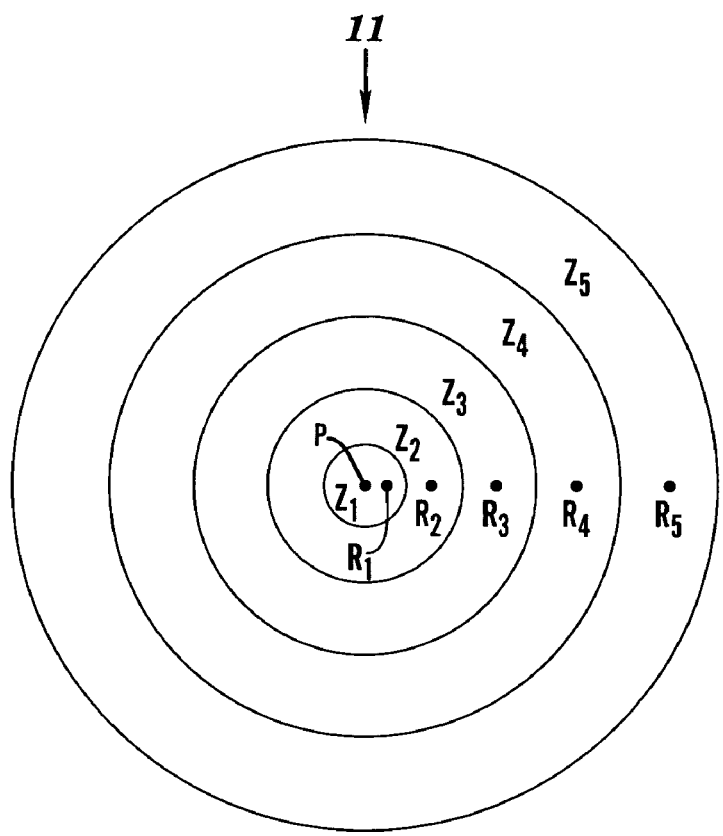
FIGS. 12–14 each depict a top view of the planar surface of the vacuum chuck of FIG. 1 such that zones of the planar surface are configured to match the surface regions on the top surface of the warped substrate of FIGS. 9–11, respectively, in accordance with embodiments of the present invention.
Figures 13, 14:
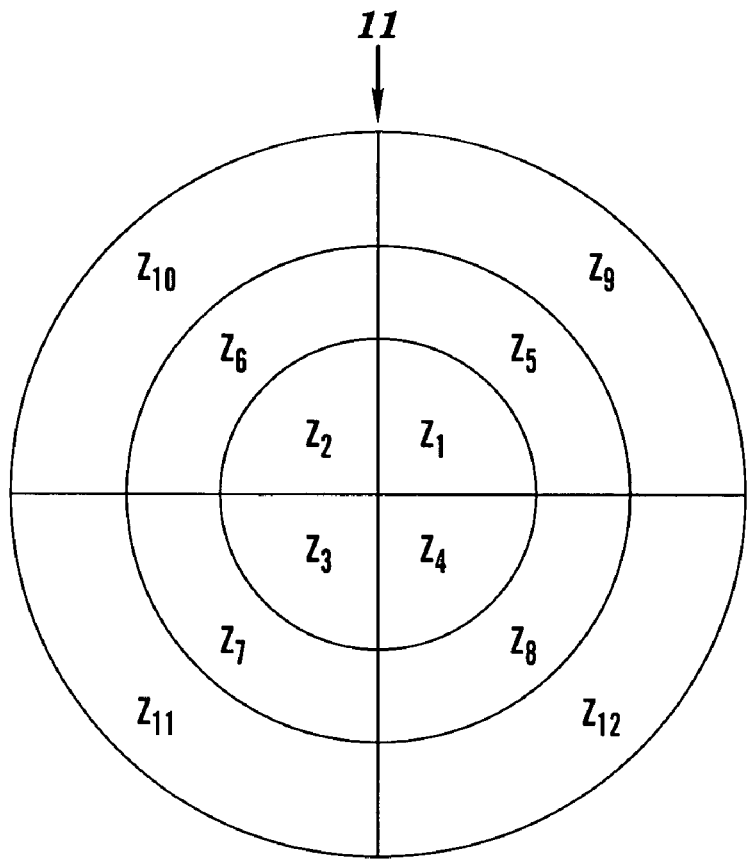

Although FIGS. 4–7 depict a cross-sectional view that does not show all vacuum ports of the vacuum chuck 10, other vacuum ports of the vacuum chuck 10 will likewise be depressurized during the successive time intervals of FIG. 4-7 in accordance with definitions of zones of the planar surface 11 discussed infra in conjunction with FIGS. 12–14, in compatibility with surface regions of the substrate 20 discussed infra in conjunction with FIGS. 9–11.

Figure 8:
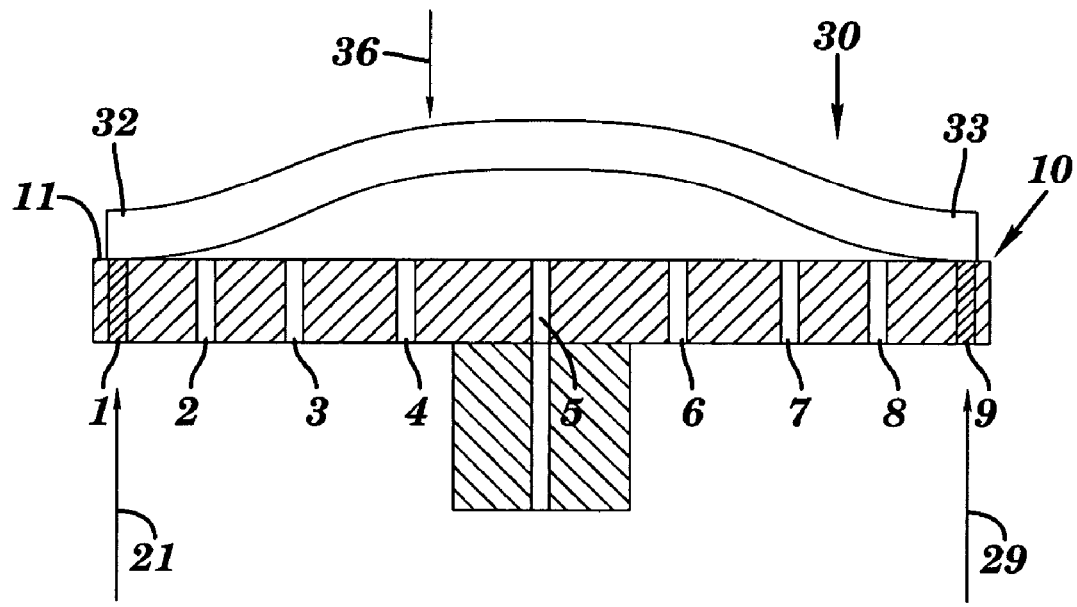
FIG. 8 depicts a first step for clamping a warped substrate to the planar surface of the vacuum chuck of FIG. 1, said warped substrate of FIG. 8 having different warpage characteristics than does the warped substrate of FIGS. 4–7, in accordance with embodiments of the present invention.

FIG. 8 depicts a first step for clamping a warped substrate 30 to the planar surface 11 of the vacuum chuck 10 of FIG. 1, said warped substrate 30 of FIG. 8 having different warpage characteristics than does the warped substrate 20 of FIGS. 4–7, in accordance with embodiments of the present invention. In particular, warped substrate 20 of FIG. 4 has an upward concavity that points in the direction 35 away from the planar surface 11 of the vacuum chuck 10. In contrast, warped substrate 30 of FIG. 8 has a downward concavity that points in the direction 36 toward the planar surface 11 of the vacuum chuck 10. In FIG. 8, the arrows 21 and 29 denote that vacuum ports 1 and 9 are depressurized so as to flatten peripheral portions 32 and 33, respectively, of the substrate 20 against the planar surface 11 of the vacuum chuck 10.

FIGS. 9–11 each depict a top view of the warped substrate 20 of FIGS. 4–7 such that surface regions on the top surface of the substrate 20 reflect the spatial distribution of the warpage, in accordance with embodiments of the present invention. The warpage in each surface region is relatively constant; i.e., the spatial variation in warpage within a surface region is small in comparison with the spatial variation in warpage between adjacent surface regions. Since the warpage may vary within each spatial region, each such surface region may be characterized by an average warpage, defined by any method known to a person of ordinary skill in the art for calculating a spatial average.

FIG. 9 depicts surface regions $S_1$, $S_2$, $S_3$, $S_4$, and $S_5$, wherein the warpage varies only radially (approximately) and is essentially or substantially independent of azimuthal angle $\theta$, such as is illustrated for the substrates 20 and 30 of FIG. 4 and FIG. 8, respectively. The average warpage in surface regions $S_1$, $S_2$, $S_3$, $S_4$, and $S_5$ are $W_1$, $W_2$, $W_3$, $W_4$, and $W_5$, respectively.

FIG. 10 depicts surface regions $S_1$, $S_2$, $S_3$, $S_4$, . . . , $S_{11}$, and $S_{12}$, wherein the warpage is modeled as being constant in each surface region. Each surface region of FIG. 10 is called a radial sector. The surface regions (i.e., radial sectors) in FIG. 10 are distributed radially with respect to azimuthal angle $\theta$. Thus the radial sectors in FIG. 10 are disposed within annular rings such that each angular ring includes n radial sectors, wherein each radial sector encompasses 360/n degrees (n=4 in FIG. 10). For n=2, 3, 4, 5, and 6, the radial sector encompasses 180, 120, 90, 72, and 60 degrees, respectively. The average warpage in surface regions $S_1$, $S_2$, $S_3$, $S_4$, . . . , $S_{11}$, and $S_{12}$ are $W_1$, $W_2$, $W_3$, $W_4$, . . . , $W_{11}$, and $W_{12}$, respectively.

FIG. 11 depicts surface regions $S_1$, $S_2$, $S_3$, . . . , $S_{11}$, and $S_{12}$, wherein the warpage is approximately constant in each surface region. The surface regions in FIG. 11 are rectangular in shape. The average warpage in surface regions $S_1$, $S_2$, $S_3$, . . . , $S_{19}$, and $S_{20}$ are $W_1$, $W_2$, $W_3$, . . . , $W_{19}$, and $W_{20}$, respectively.

FIGS. 12–14 each depict a top view of the planar surface 11 of the vacuum chuck 10 of FIG. 1 such that zones of the planar surface 11 are configured to match the surface regions on the warped substrate 20 of FIGS. 9–11, respectively, in accordance with embodiments of the present invention. Each zone comprises a vacuum port group (i.e., a group of vacuum ports).

FIG. 12 depicts zones $Z_1$, $Z_2$, $Z_3$, $Z_4$, and $Z_5$ on the planar surface 11 which respectively comprise vacuum port groups $G_1$, $G_2$, $G_3$, $G_4$, and $G_5$ and are respectively matched to surface regions $S_1$, $S_2$, $S_3$, $S_4$, and $S_5$ of the substrate 20 of FIG. 9. The zones $Z_1$, $Z_2$, $Z_3$, $Z_4$, and $Z_5$ and associated vacuum port groups $G_1$, $G_2$, $G_3$, $G_4$, and $G_5$ are distributed within concentric annular rings at an average radial distance $R_1$, $R_2$, $R_3$, $R_4$, and $R_5$, respectively, from a common center point P on the planar surface 11, wherein $R_1<R_2<R_3<R_4<R_5$. The average warpage $W_1$, $W_2$, $W_3$, $W_4$, and $W_5$ in surface regions $S_1$, $S_2$, $S_3$, $S_4$, and $S_5$, respectively, satisfy $W_1 \leq W_2 \leq \ldots \leq W_5$ and $W_1<W_5$. In an embodiment, $W_1<W_2<W_3<W_3<W_5$. Therefore, the warpage increases in moving radially outward from the common center point P, corresponding to the substrate 20 in FIG. 4 which has upward concavity directed away from the surface 11 of the vacuum chuck 10. For the downward concavity substrate 30 of FIG. 8, the zones would be radially reversed such that the zones would be distributed radially outward from common center pont P in an order of $Z_5$, $Z_4$, $Z_3$, $Z_2$, and $Z_1$ at corresponding radial distances of $R_5$, $R_4$, $R_3$, $R_2$, and $R_1$ such that $R_1>R_2>R_3>R_4>R_5$.

FIG. 13 depicts zones $Z_1$, $Z_2$, $Z_3$, $Z_4$, . . . , $Z_{11}$, and $Z_{12}$ on the planar surface 11 which respectively comprises vacuum port groups $G_1$, $G_2$, $G_3$, $G_4$, . . . , $G_{11}$, and $G_{12}$ and are respectively matched to surface regions $S_1$, $S_2$, $S_3$, $S_4$, . . . , $S_{11}$, and $S_{12}$ of the substrate 20 of FIG. 10. Similar to FIG. 10, the zones and associated vacuum port groups in FIG. 13 are radial sectors disposed within annular rings such that each annular ring includes n radial sectors, wherein each radial sector encompasses 360/n degrees (n=4 in FIG. 13). For n=2, 3, 4, 5, and 6, the radial sector encompasses 180, 120, 90, 72, and 60 degrees, respectively.

FIG. 14 depicts zones $Z_1$, $Z_2$, $Z_3$, . . . , $Z_{19}$, and $Z_{20}$ on the planar surface 11 which respectively comprise vacuum port groups $G_1$, $G_2$, $G_3$, . . . , $G_{19}$, and $G_{20}$ and are respectively matched to surface regions $S_1$, $S_2$, $S_3$, . . . , $S_{19}$, and $S_{20}$ of the substrate 20 of FIG. 11.

Figure 15:
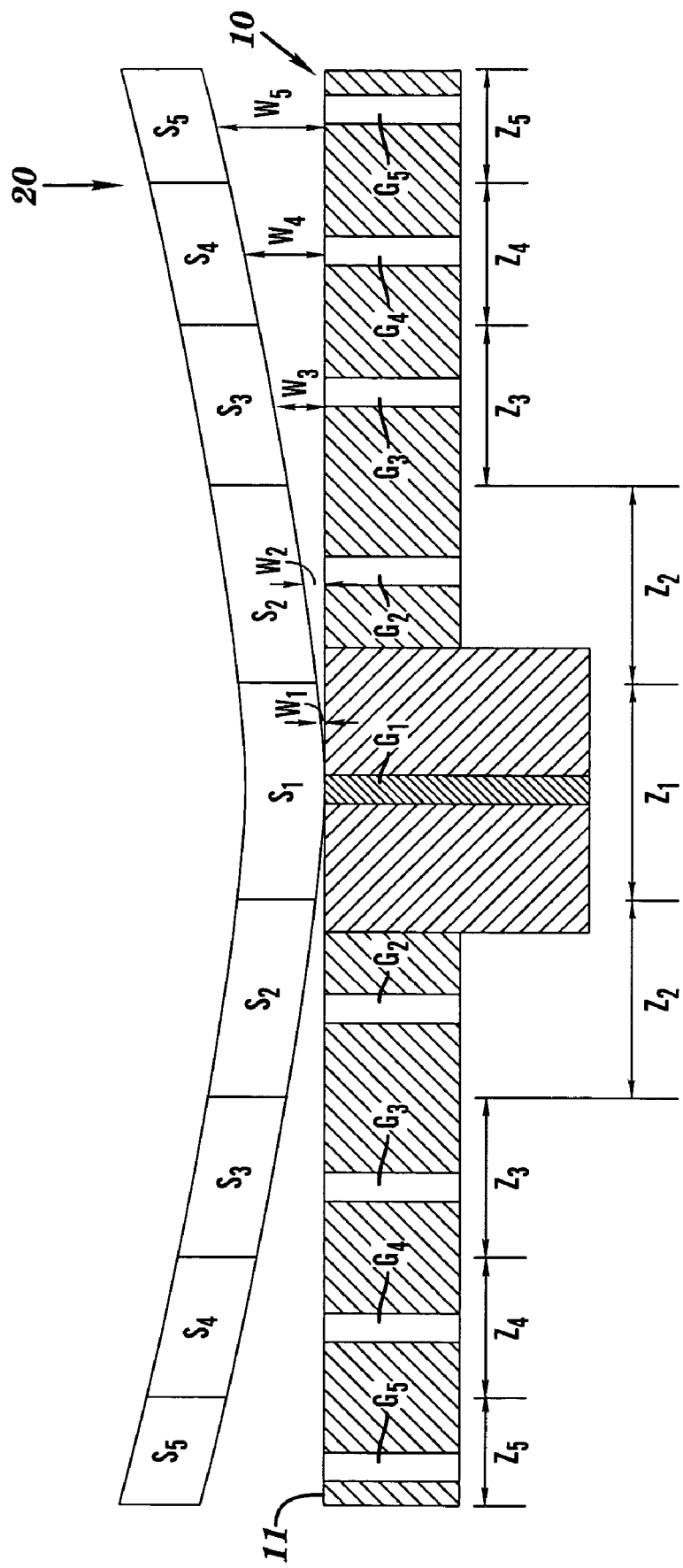
FIG. 15 depicts a warped substrate on the planar surface of the vacuum chuck of FIG. 1 to illustrate notation used for describing the clamping method of the present invention.

FIG. 15 depicts the warped substrate 20 of FIG. 4 on the planar surface 11 of the vacuum chuck 10 of FIG. 1 to illustrate notation used for describing the clamping method of the present invention. FIG. 15 shows the substrate 20 as comprising surface regions $S_1$, $S_2$, $S_3$, $S_4$, and $S_5$, with average warpage of $W_1$, $W_2$, $W_3$, $W_4$, and $W_5$, respectively, such that $W_1 \leq W_2 \leq \ldots \leq W_N$ and $W_1<W_N$. In an embodiment, $W_1<W_2<\ldots<W_5$. The vacuum chuck 10 comprise zones $Z_1$, $Z_2$, $Z_3$, $Z_4$, and $Z_5$ on the planar surface 11 which respectively comprises vacuum port groups $G_1$, $G_2$, $G_3$, $G_4$, and $G_5$ and are respectively matched to surface regions $S_1$, $S_2$, $S_3$, $S_4$, and $S_5$ of the substrate 20. Although the substrate 20 and the planar surface 11 in FIG. 15 exhibit axial symmetry (i.e., the warpage varies essentially only in the radial direction), the notation used in FIG. 15 is generally applicable without geometrical symmetries or constraints.

Figure 16:
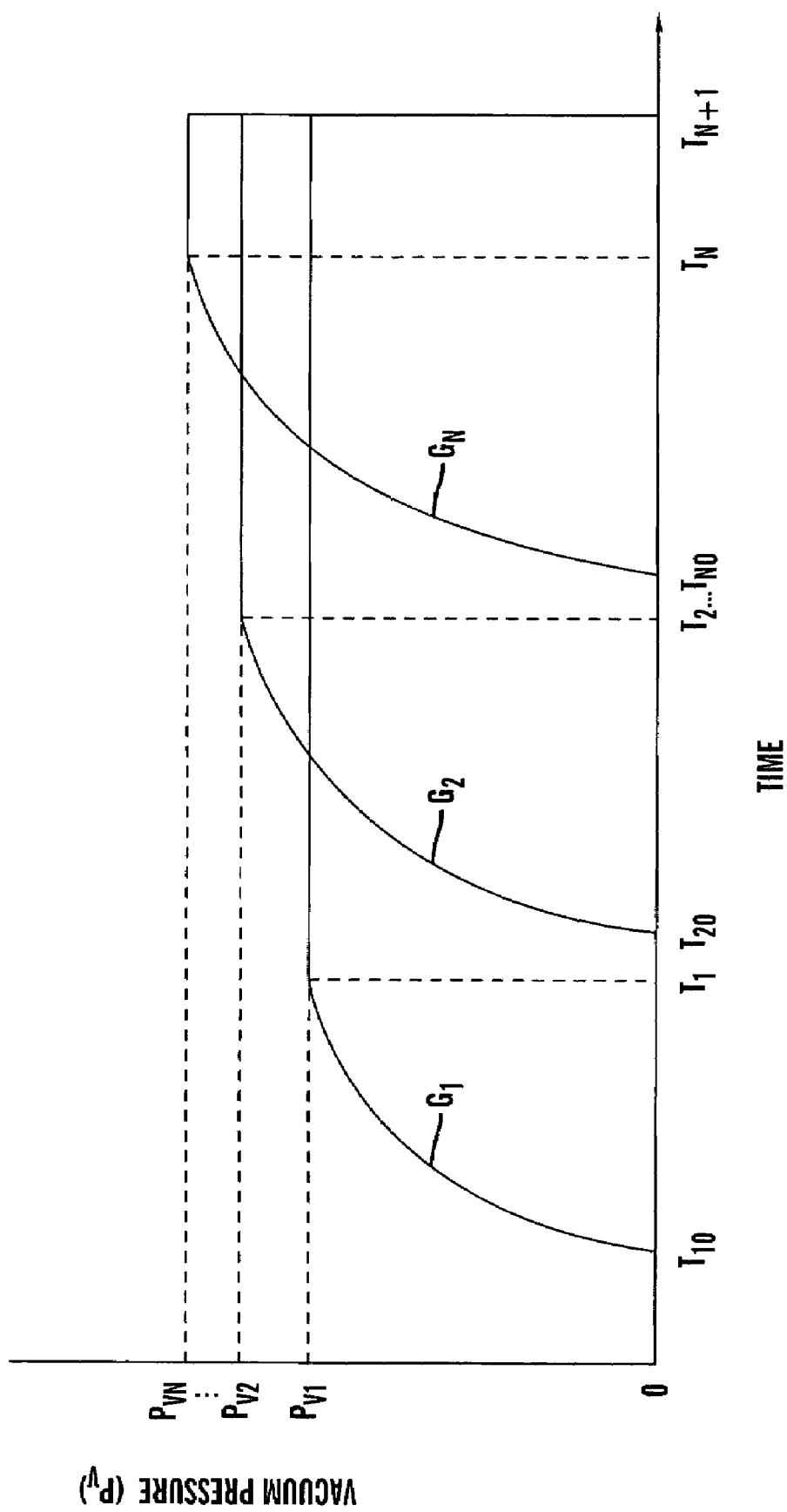
FIG. 16 depicts a time sequence of depressurization for clamping a warped substrate to a planar surface of a vacuum chuck, in accordance with embodiments of the present invention.

FIG. 16 depicts a time sequence of depressurization to generate a vacuum pressure in the vacuum port groups for clamping a warped substrate to a planar surface of vacuum chuck, in accordance with embodiments of the present invention. For illustrative purposes only without limiting the scope of the present invention, FIG. 16 describes inter alia the clamping of the warped substrate 20 to the planar surface 11 of the vacuum chuck 10 of FIG. 15. In FIG. 16, a vacuum pressure $P_V$ is measured in units of psiv and is defined according to $P_V = P_1 - P_A$, wherein $P_1$ is 1 atmosphere of pressure (i.e., 14.7 psia) and $P_A$ is absolute pressure. Thus $P_V$ increases with increasing depressurization as a vacuum develops. Therefore, $P_V = 0$ psiv occurs when the pressure is 14.7 psia and corresponds to no vacuum (i.e., no depressurization), whereas $P_V = 14.7$ psiv occurs when the pressure is 0 psia and corresponds to a pure vacuum.

In FIG. 16, N denotes the number of vacuum port groups in the vacuum chuck, and N is at least 2. The planar surface of the vacuum chuck comprises vacuum port group $G_1$, $G_2, \ldots, G_N$ distributed in zone $Z_1, Z_2, \ldots, Z_N$, respectively. The substrate comprises surface regions $S_1, S_2, \ldots,$ and $S_N$, with average warpage of $W_1, W_2, \ldots,$ and $W_N$, respectively, such that $W_1 \leq W_2 \leq \ldots \leq W_N$ and $W_1 < W_N$. In an embodiment, $W_1 < W_2 < \ldots < W_N$. The vacuum port group $G_1$ is depressurized beginning at time $T_{10}$ to generate a vacuum pressure of $P_{V1}$ at time $T_1$, wherein the vacuum pressure $P_{V1}$ is subsequently maintained for vacuum port group $G_1$ until the vacuum is subsequently released from all vacuum ports of the vacuum chuck 20 at time $T_{N+1}$. The vacuum port group $G_2$ is depressurized beginning at time $T_{20}$, wherein $T_{20} > T_1$, to generate a vacuum pressure of $P_{V2}$ at time $T_2$, wherein the vacuum pressure $P_{V2}$ is maintained for vacuum port group $G_2$ until the vacuum is subsequently released from all vacuum ports of the vacuum chuck 20 at time $T_{N+1}$. The process of depressurization continues sequentially in a similar fashion for the remaining vacuum port groups. The last vacuum port group $G_N$ is depressurized beginning at time $T_{N0}$, wherein $T_{N0} > T_{N-1}$, to generate a vacuum pressure of $P_{VN}$ at time $T_N$, wherein the vacuum pressure PVN is maintained for vacuum port group $G_N$ until the vacuum is subsequently released from all vacuum ports of the vacuum chuck at time $T_{N+1}$ In FIG. 16, the generated vacuum pressures are in accordance with the relationship: $P_{V1} < P_{V2} < \ldots < P_{VN}$. In general, the values of $P_{V1}, P_{V2}, \ldots, P_{VN}$ may be independent of one another. For example, the vacuum pressure relationship may comprise: $P_{V1} \leq P_{V2} \leq \ldots \leq P_{VN}$ such that $P_{V1} < P_{VN}$. In an embodiment, the vacuum pressures $P_{V1}, P_{V2}, \ldots, P_{VN}$ may be related according to $P_{V1} < P_{V2} < \ldots < P_{VN}$. In an embodiment, the vacuum pressures $P_{V1}, P_{V2}, \ldots, P_{VN}$ may each be about equal to a common vacuum pressure $P_{V0}$ so that each vacuum port group is at the common vacuum pressure $P_{V0}$.

In FIG. 16, the times $T_1, T_2, \ldots, T_N,$ and $T_{N+1}$ are related according to $T_1 < T_2 < \ldots < T_N < T_{N+1}$. The times $T_1, T_2, \ldots, T_N,$ and $T_{N+1}$ may also be related such that $T_2 - T_1, \ldots, T_N - T_{N-1}$ are each about equal to a common time interval $\Delta T$. The condition $W_1 \leq W_2 \leq \ldots < W_N$ and $W_1 < W_N$ combined with the condition $T_1 < T_2 < \ldots < T_N < T_{N+1}$ ensures that the surface regions $S_1, S_2, \ldots,$ and $S_N$ are flattened by being successively clamped to the planar surface 11 timewise in order of increasing warpage. At each time T during a time interval $T_N + \delta T_N < T < T_{N+1}$ the entire substrate is clamped flat against the planar surface, wherein $\delta T_N$ is a time duration for clamping surface region $S_N$ to the planar surface following application of the vacuum pressure $P_{VN}$ to the surface region $S_N$. At time $T_{N+1}$, the vacuum is released in all vacuum port groups $G_1, G_2, \ldots, G_N$.

If the warpage values $W_1, W_2, \ldots, W_N$ varies about only radially, then the vacuum ports in the matched vacuum port group $G_1, G_2, \ldots, G_N$ in zone $Z_1, Z_2, \ldots, Z_N$ are distributed within an annular ring at an average radial distance $R_1, R_2, \ldots, R_N$, respectively, from a common center point on the planar surface 11 as in FIG. 12, which may represent inter alia the concave upward substrate 20 of FIG. 4 or the concave downward substrate 30 of FIG. 8. In light of the relationship $T_1 < T_2 < \ldots < T_N < T_{N+1}$, the radial distances are related according to $R_1 < R_2 < \ldots < R_N$ for the concave upward substrate 20 of FIG. 4, and according to $R_1 > R_2 > \ldots > R_N$ for the concave downward substrate 30 of FIG. 8.

In FIG. 16, the magitude of the time intervals $T_2 - T_1, \ldots, T_N - T_{N-1}$ is case dependent and may be a function of such parameters as: magnitude of warpage, density of warped substrate, vacuum pumping parameters, etc. In an embodiment pertaining to the flattening of semiconductor wafers, the time intervals may be less than 0.1 seconds to less than 1 second.

Figure 17:
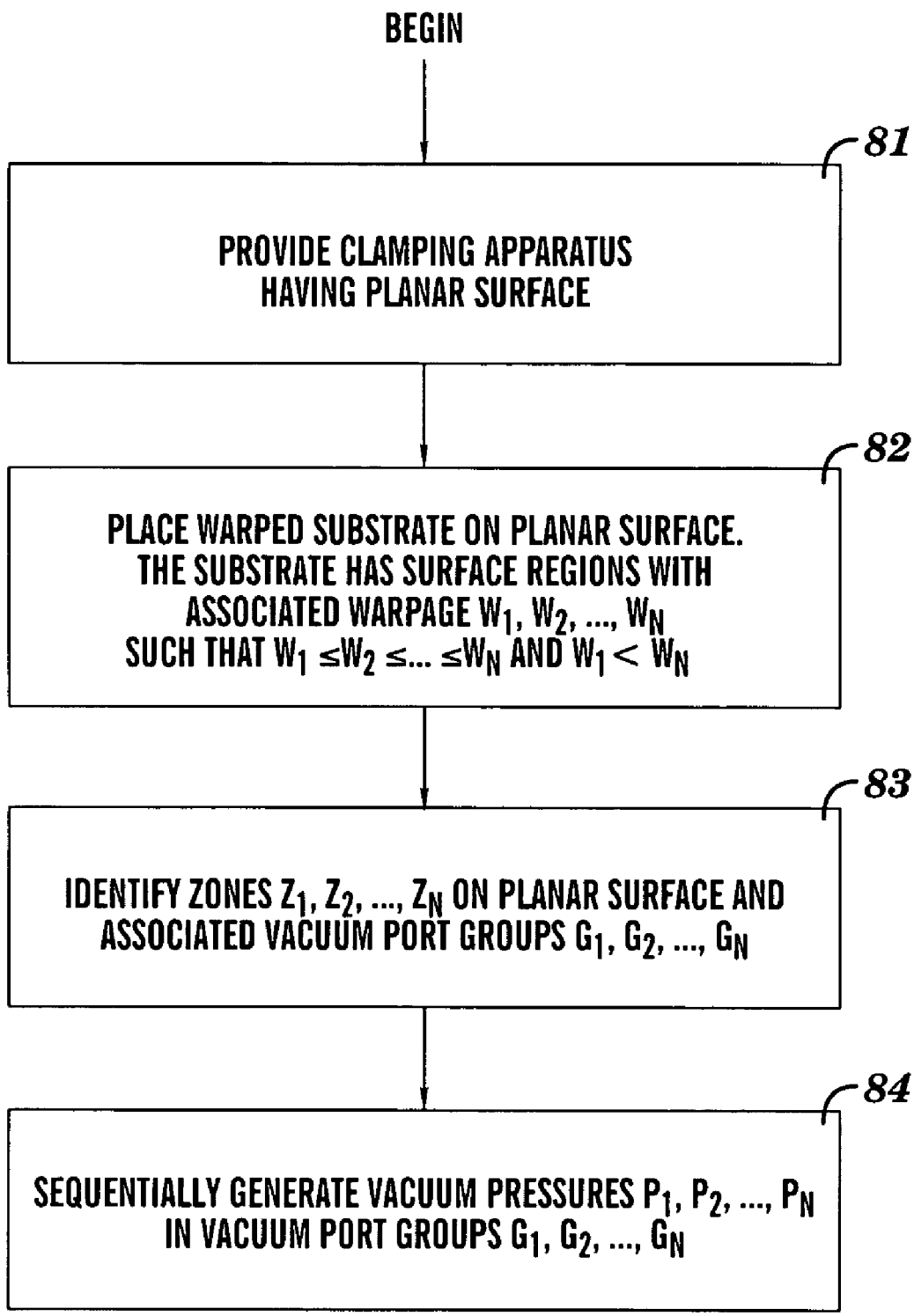
FIG. 17 is a flow chart depicting a method of a method of flattening a warped substrate by clamping a warped substrate to a planar surface of the vacuum chuck, in accordance with embodiments of the present invention.

FIG. 17 is a flow chart depicting steps 81–84 of a method of flattening a warped substrate, in accordance with embodiments of the present invention.

Step 81 provides a clamping apparatus having a planar surface, such as the vacuum chuck 10 of FIG. 1 having the planar surface 11. The clamping apparatus has a plurality of vacuum ports distributed within the planar surface.

Step 82 places the warped substrate on the planar surface such that a portion of an external surface of the substrate is in direct mechanical contact with the planar surface. The external surface of the substrate comprises N surface regions $S_1, S_2, \ldots, S_N$ having an average warpage of $W_1, W_2, \ldots, W_N$, respectively, such that $W_1 \leq W_2 \leq \ldots \leq W_N$ and $W_1 < W_N$. In an embodiment, $W_1 < W_2 < \ldots < W_N$. N is at least 2. A reason why the warpage of two consecutively ordered surface regions ($S_i$ and $S_{i+1}$) may be the same average warpage (i.e. $W_i \leq W_{i+1}$ may apply instead of $W_i < W_{i+1}$) is that the combination of $S_i$ and $S_{i+1}$ may be so large that the depressurization in subsequent in step 84 may be easier to control with two smaller surface regions ($S_i$ and $S_{i+1}$) than with one surface region of $S_i$ and $S_{i+1}$ combined.

Step 83 identifies zone $Z_1, Z_2, \ldots, Z_N$ of the planar surface respectively comprising vacuum port groups $G_1, G_2, \ldots, G_N$. Each vacuum port group comprises at least one vacuum port of the plurality of vacuum ports. Each vacuum port group is adapted to have a common vacuum pressure at each vacuum port therein.

Step 84 sequentially depressurized vacuum port groups $G_1, G_2, \ldots, G_N$ by sequentially generating a vacuum pressure $P_{V1}, P_{V2}, \ldots, P_{VN}$ at each vacuum port within group $G_1, G_2, \ldots, G_N$, at a time of $T_1, T_2, \ldots, T_N$ to clamp surface region $S_1, S_2, \ldots, S_N$ to zone $Z_1, Z_2, \ldots, Z_N$, respectively. The vacuum pressure $P_{V1}, P_{V2}, \ldots, P_{VN}$ is respectively maintained at the vacuum ports of group $G_1, G_2, \ldots, G_N$ until time $T_{N+1}$, wherein $T_1 < T_2 < \ldots < T_N < T_{N+1}$. At time $T_{N+1}$, the vacuum is released in all vacuum port groups as explained supra in conjunction with FIG. 16.

Figure 18:
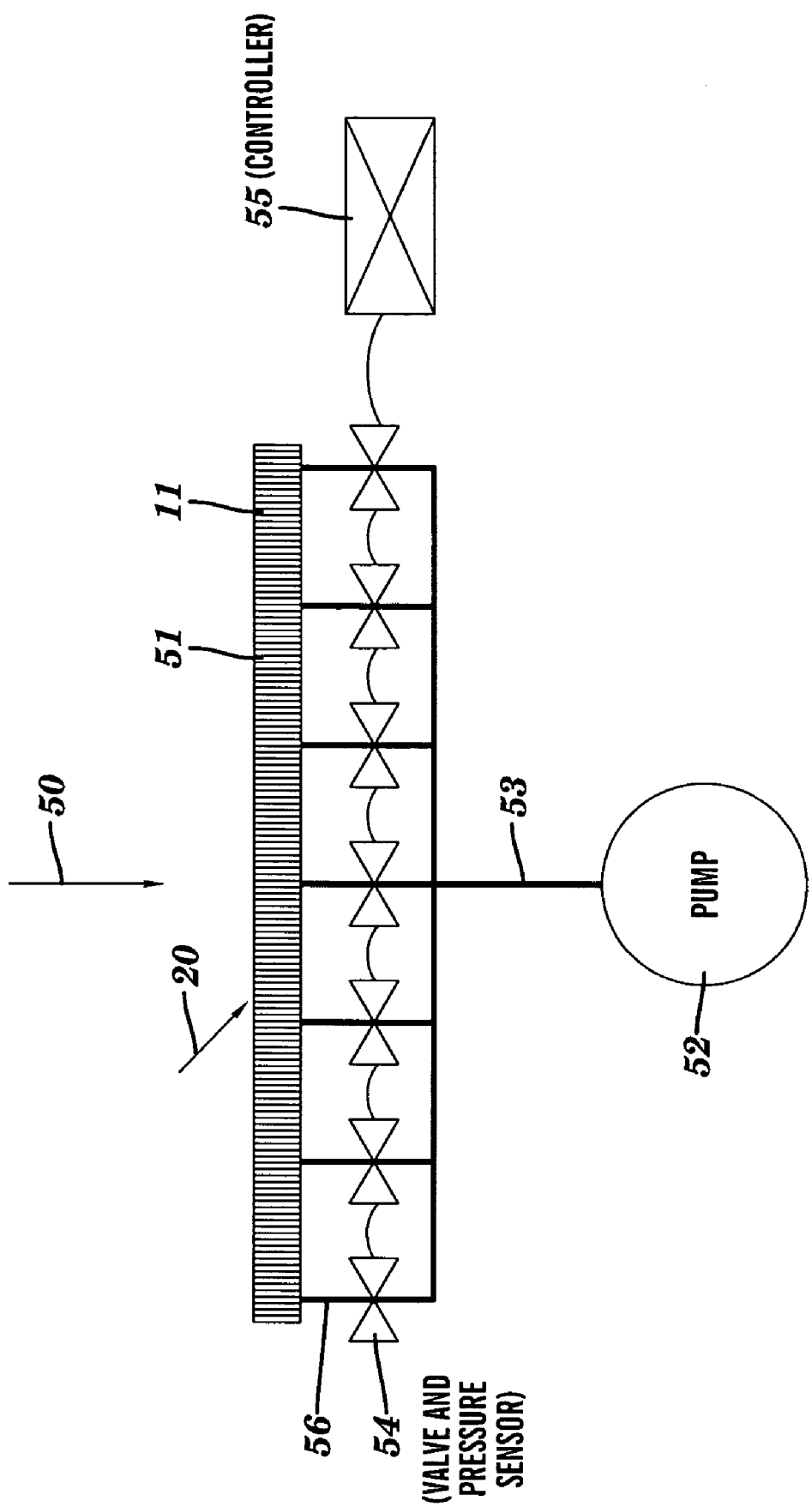
FIG. 18 depicts a pressure regulating system pertaining to the vacuum chuck of FIG. 1, said vacuum chuck comprising a plurality of ports on a planar surface, in accordance with embodiments of the present invention.

FIG. 18 depicts a clamping apparatus comprising a pressure regulating system 50 pertaining to the vacuum chuck 20 of FIG. 1, in accordance with embodiments of the present invention. The vacuum chuck 20 comprises a plurality of vacuum ports 51 comprised by N vacuum port groups $G_1, G_2, \ldots, G_N$ within corresponding zones $Z_1, Z_2, \ldots, Z_N$ on the planar surface 11. N is at least 2. At least one combined valve and pressure sensor 54 is wired to a main controller 55. The main controller 55 utilizes either feedback control or a timing mechanism to control an application of a vacuum pressure ($P_V$) to a particular vacuum port group of the N vacuum port groups. When the valve (of the valve and pressure sensor 54) is open, the vacuum line 56 is open to a vacuum pump 52 by way of a feeder line 53, thereby enabling the vacuum pump 52 to generate the vacuum pressure $P_V$.

In FIG. 18, the controller 55 controls the sequential depressurization of the vacuum port groups in accordance with the timing mechanism of FIG. 16 for flattening the substrate 20 in consistency with FIG. 15. Accordingly, the controller 55 may perform the steps of: identifying the zones $Z_1, Z_2, \ldots, Z_N$ of the planar surface which respectively comprise vacuum port groups $G_1, G_2, \ldots, G_N$, wherein each vacuum port group comprises at least one vacuum port; and controlling generation of a vacuum pressure $P_{V1}, P_{V2}, \ldots, P_{VN}$ at each vacuum port within group $G_1, G_2, \ldots, G_N$, at a time of $T_1, T_2, \ldots, T_N$ to clamp surface region $S_1, S_2, \ldots, S_N$ to zone $Z_1, Z_2, \ldots, Z_N$, respectively, wherein the vacuum pressure $P_{V1}, P_{V2}, \ldots, P_{VN}$ is maintained at the vacuum ports of group $G_1, G_2, \ldots, G_N$, respectively, until time $T_{N+1}$, and wherein $T_1 < T_2 < \ldots < T_N < T_{N+1}$. The preceding "identifying" step may be performed by, inter alia, reading the identification of $Z_1, Z_2, \ldots, Z_N$ and associated information from a file or database. After said "identifying", the controller 55 may dynamically configure the zones $Z_1, Z_2, \ldots, Z_N$ and associated vacuum port groups $G_1, G_2, \ldots, G_N$ as described infra.

The zones $Z_1, Z_2, \ldots, Z_N$ and associated vacuum port groups $G_1, G_2, \ldots, G_N$ may be built into the vacuum pump. Alternatively, the zones $Z_1, Z_2, \ldots, Z_N$ and associated vacuum port groups $G_1, G_2, \ldots, G_N$ may be dynamically configured within the vacuum pump such as by selective adjustment of the pressure at each port (e.g., by adjusting fluid flow into or out of the port such as by, inter alia, closing, opening, or partially opening a valve that is coupled to the port). The controller 55 may be programmed to control such valve adjustments to configure the zones $Z_1, Z_2, \ldots, Z_N$ and associated vacuum port groups $G_1, G_2, \ldots, G_N$. Also alternatively, while FIG. 18 shows one vacuum pump 52, the pressure regulating system 50 may include multiple vacuum pumps selectively and dynamically coupled to different groups of ports under program control of the controller 55 for configuring the zones $Z_1, Z_2, \ldots, Z_N$ and associated vacuum port groups $G_1, G_2, \ldots, G_N$.

Figure 19:
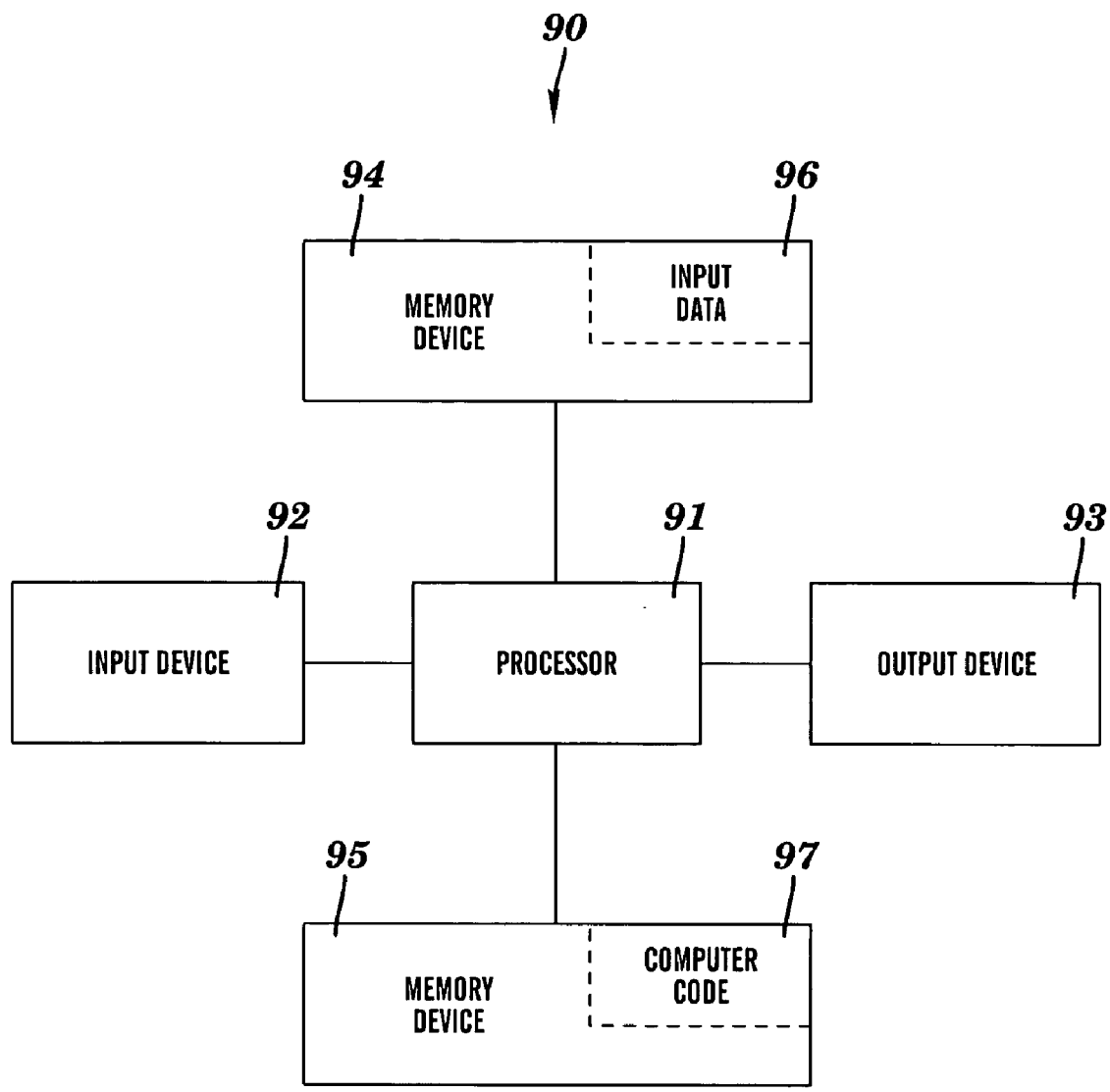
FIG. 19 depicts a computer system used for flattening a warped substrate by clamping a warped substrate to the planar surface of a vacuum chuck, in accordance with embodiments of the present invention.

The controller 55 may function as the processor of a computer or computer system such as, inter alia, the computer system 90 of FIG. 19 described infra.

FIG. 19 depicts a computer system 90 used for flattening a warped substrate (e.g., the warped substrate 20 of FIG. 18) to a planar surface of a vacuum chuck (e.g., the planar surface 11 of the vacuum chuck 10 of FIG. 1 or FIG. 18), in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes an algorithm for computer system 90 for use in flattening a warped substrate to a planar surface of a vacuum chuck. The processor 91, which may include the controller 55 of FIG. 18, executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 19) may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

While FIG. 19 shows the computer system 90 as a particular configuration of hardware and software, any configuration of hardware and software, as would be known to a person of ordinary skill in the art, may be utilized for the purposes stated supra in conjunction with the particular computer system 90 of FIG. 19. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention

What is claimed is:

1. A method for flattening a warped substrate, comprising:
placing the warped substrate on a planar surface of a clamping apparatus such that an external surface of the substrate is in direct mechanical contact with the planar surface, wherein the external surface of the substrate comprises N surface regions $S_1, S_2, \ldots, S_N$ having an average warpage of $W_1, W_2, \ldots, W_N$, respectively, wherein $W_1 \leq W_2 \leq \ldots \leq W_N$ and $W_1 < W_N$, wherein zones $Z_1, Z_2, \ldots, Z_N$ of the planar surface respectively comprise vacuum port groups $G_1, G_2, \ldots, G_N$, wherein each vacuum port group comprises at least one vacuum port, and wherein N is at least 2; and
generating a vacuum pressure $P_{V1}, P_{V2}, \ldots, P_{VN}$ at each vacuum port within group $G_1, G_2, \ldots, G_N$, at a time of $T_1, T_2, \ldots, T_N$ to clamp surface region $S_1, S_2, \ldots, S_N$ to zone $Z_1, Z_2, \ldots, Z_N$, respectively, wherein the vacuum pressure $P_{V1}, P_{V2}, \ldots, P_{VN}$ is maintained at the vacuum ports of group $G_1, G_2, \ldots, G_N$, respectively, until time $T_{N+1}$, and wherein $T_1 < T_2 < \ldots < T_N < T_{N+1}$.

2. The method of claim 1, further comprising dynamically configuring the zones $Z_1, Z_2, \ldots, Z_N$ and the vacuum port groups $G_1, G_2, \ldots, G_N$ from a plurality of vacuum ports coupled to the planar surface.

3. The method of claim 1, wherein $W_1 < W_2 < \ldots < W_N$.

4. The method of claim 1, wherein at each time T during a time interval $T_N + \delta T_N < T < T_{N+1}$ the entire substrate is clamped flat against the planar surface, and wherein $\delta T_N$ is a time duration for clamping surface region $S_N$ to the planar surface following application of the vacuum pressure $P_{VN}$ to the surface region $S_N$.

5. The method of claim 1,
wherein $P_{V1}, P_{V2}, \ldots, P_{VN}$ are each about equal to a common vacuum pressure $P_0$ so that each vacuum port group is at the common vacuum pressure $P_{V0}$; or
wherein $P_{V1} \leq P_{V2} \leq \ldots \leq P_{VN}$ such that $P_{V1} \leq P_{VN}$.

6. The method of claim 1, wherein $P_{V1} \leq P_{V2} \leq \ldots \leq P_{VN}$, such that $P_{V1} < P_{VN}$.

7. The method of claim 1, wherein the zones $Z_1, Z_2, \ldots, Z_N$ and associated vacuum port groups $G_1$, $G_2, \ldots, G_N$ are each distributed within a concentric annular ring at an average radial distance $R_1, R_2, \ldots, R_N$, respectively, from a common center point on the planar surface.

8. The method of claim 7, wherein $R_1<R_2<\ldots<R_N$ or $R_1>R_2>\ldots>R_N$.

9. The method of claim 1, wherein the zones $Z_1, Z_2, \ldots, Z_N$ and associated vacuum port groups $G_1, G_2, \ldots, G_N$ are distributed within radial sectors of concentric annular rings, wherein each concentric annular ring comprises n radial sectors, wherein each radial sector encompasses 360/n degrees, and wherein n is an integer of at least 1.

10. The method of claim 1, wherein the substrate is a semiconductor wafer.

11. The method of claim 1, further comprising releasing the pressure $P_{V1}, P_{V2}, \ldots, P_{VN}$ at each vacuum port within group $G_1, G_2, \ldots, G_N$, respectively, at time $T_{N+1}$.

12. The method of claim 1, wherein the vacuum ports in the vacuum port groups $G_1, G_2, \ldots, G_N$ are collectively distributed uniformly in both a radial direction and an azimuthal direction with respect to the common center point on the planar surface.

13. The method of claim 1, wherein the clamping apparatus is a vacuum chuck.

14. The method of claim 1, wherein the planar surface has a circular shape or a rectangular shape.

15. The method of claim 1, wherein the planar surface has a circular shape.

16. The method of claim 1, wherein a spatial variation of warpage within both a first surface region and a second surface region of the N surface regions is less than a spatial variation of warpage between the first surface region and the second surface region, and wherein the first surface region is adjacent to the second surface region.

17. The method of claim 1, wherein time intervals $T_2-T_1, \ldots, T_N-T_{N-1}$ are each about equal to a common time interval $\Delta T$.

18. The method of claim 1, wherein time intervals $T_2-T_1, \ldots, T_N-T_{N-1}$ are a function of a magnitude of warpage of the warped substrate.

19. The method of claim 1, wherein time intervals $T_2-T_1, \ldots, T_N-T_{N-1}$ are a function of a density of warpage of the warped substrate.

20. The method of claim 1, wherein time intervals $T_2-T_1, \ldots, T_N-T_{N-1}$ are each less than 1 second.

21. The method of claim 1, wherein time intervals $T_2-T_1, \ldots, T_N-T_{N-1}$ are each less than 0.1 second.

22. The method of claim 7, wherein two vacuum ports in each ring of rings $R_2, \ldots, R_N$ are located 180 degrees apart from each other.

23. The method of claim 8,
wherein the warped substrate has an upward concavity that points in a direction away from the planar surface and $R_1<R_2<\ldots<R_N$; or
wherein the warped substrate has a downward concavity that points in a direction toward the planar surface and $R_1>R_2>\ldots>R_N$.

24. The method of claim 23, wherein the warped substrate has an upward concavity that points in a direction away from the planar surface and $R_1<R_2<\ldots<R_N$.

25. The method of claim 23, wherein the warped substrate has a downward concavity that points in a direction toward the planar surface and $R_1>R_2>\ldots>R_N$.

26. The method of claim 1, wherein said generating comprises:
identifying zones $Z_1, Z_2, \ldots, Z_N$; and
controlling said generating, wherein said controlling is performed by a controller.

27. The method of claim 26, wherein the controller is a processor of a computer or a computer system.

28. The method of claim 27, wherein said identifying comprises reading an identification of zones $Z_1, Z_2, \ldots, Z_N$ from a file or database.

29. A computer program product, comprising a computer usable medium having a computer readable program code embodied therein, said computer readable program code comprising an algorithm adapted to implement the method of claim 26.

* * * * *